United States Patent
Nakamura

(10) Patent No.: US 7,974,135 B2
(45) Date of Patent: Jul. 5, 2011

(54) NON-VOLATILE SEMICONDUCTOR MEMORY DEVICE AND ERASING METHOD THEREOF

(75) Inventor: Dai Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/409,676

(22) Filed: Mar. 24, 2009

(65) Prior Publication Data

US 2009/0303799 A1    Dec. 10, 2009

(30) Foreign Application Priority Data

Jun. 10, 2008    (JP) .................. 2008-151287

(51) Int. Cl.
 *G11C 16/06*    (2006.01)

(52) U.S. Cl. ................ 365/185.22; 365/185.2

(58) Field of Classification Search ............ 365/185.17, 365/185.2, 185.22, 185.29, 185.33
See application file for complete search history.

(56) References Cited

U.S. PATENT DOCUMENTS

| 6,385,112 | B1 * | 5/2002 | Kurosaki ............... 365/185.33 |
| 7,079,437 | B2 | 7/2006 | Hazama et al. |
| 7,239,556 | B2 | 7/2007 | Abe et al. |
| 7,263,000 | B2 | 8/2007 | Hazama et al. |
| 7,272,050 | B2 * | 9/2007 | Han et al. ............... 365/185.22 |
| 7,480,178 | B2 * | 1/2009 | Park et al. .............. 365/185.17 |
| 7,593,259 | B2 * | 9/2009 | Kim ...................... 365/185.03 |
| 2006/0034128 | A1 * | 2/2006 | Han et al. ............... 365/185.29 |

FOREIGN PATENT DOCUMENTS

JP    2005-235260    9/2005

* cited by examiner

*Primary Examiner* — Gene N. Auduong

(74) *Attorney, Agent, or Firm* — Oblon, Spivak, McClelland, Maier & Neustadt, L.L.P.

(57) ABSTRACT

A non-volatile semiconductor memory device including a NAND cell unit with a plurality of electrically rewritable and non-volatile memory cells connected in series, one end thereof being coupled to a bit line via a first select gate transistor while the other end is coupled to a source line via a second select gate transistor, wherein the memory device has an erase-verify mode for verifying an erase state of the memory cells in the NAND cell unit, the erase-verify mode including two verify-read operations adapted according to cell ranges to be erase-verified in the NAND cell unit.

11 Claims, 9 Drawing Sheets

NON-VOLATILE SEMICONDUCTOR MEMORY DEVICE AND ERASING METHOD THEREOF

CROSS-REFERENCE TO RELATED APPLICATION

This application is based on and claims the benefit of priority from the prior Japanese Patent Application No. 2008-151287, filed on Jun. 10, 2008, the entire contents of which are incorporated herein by reference.

BACKGROUND OF THE INVENTION

1. Field of the Invention

This invention relates to a non-volatile semiconductor memory device, specifically to a method of erasing the device, which is able to assure the erase level of memory cells in a NAND cell unit.

2. Description of the Related Art

A NAND-type flash memory is well known as one of electrically rewritable and non-volatile semiconductor memories (EEPROMs). In the NAND type flash memory, there is prepared a floating gate (FG) surrounded by an insulating film disposed between a word line and a p-type well on a semiconductor substrate. Although a charge trap layer may be used in place of the floating gate, the floating gate type of memory cells will be explained in the following description. Control the charge amount in the floating gate, and the threshold voltage of the memory cell may be controlled, so that the different threshold voltage states may be stored as data.

In a data write or program mode of the NAND-type flash memory, a p-type of cell well is applied with 0V; and a selected word line is applied with write or program voltage Vpgm. Under the condition, electrons are injected into the floating gate of a selected memory cell by FN tunneling. That is, the selected cell in an erase state with a negative threshold voltage is selectively written into a positive threshold state.

Data erase is performed by a block. In this erase mode, all word lines in a selected block are set at 0V or near it; and the p-type well is applied with erase voltage Vera. With this voltage application, electrons stored in the floating gates are discharged. In this erase mode, it is in need of performing erase-verify read for verifying whether the cells in the selected block are set under a certain negative threshold state or not.

One problem in the NAND-type flash memory, which is generated in accordance with the progress of cell shrinking and integration, is in that the influence of capacitive coupling between cells becomes large. Specifically, in a write mode or an erase mode, cells disposed adjacent to the select gate transistors are set under a bias condition different from that in the remaining cells due to the influence of capacitive coupling. Therefore, there is generated a certain variation with respect to the write threshold level or erase threshold level (for example, refer to JP-A-2004-127346).

Explaining in detail, there is generated such a problem in a write mode that cells adjacent to the select gate transistors are erroneously written due to GIDL (Gate-induced Drain Leakage) current. Further, in an erase mode, cells adjacent to the select gate transistors may be erroneously judged as passed, in spite of that the threshold level is higher than a suitable value, due to the influence of capacitive coupling from the select gate transistors.

For example, as shown in JP-A-2004-127346, some measures for the above-described threshold variation have been provided as useful ones as follows: cells adjacent to the select gate transistors serve as dummy cells, which are not used for storing data; and these cells adjacent to the select gate transistors are used under a bias condition different from that of other cells.

However, as the cell shrinking and integration are more advanced, there is generated another problem even if the cells adjacent to the select gate transistors are dealt with dummy cells. That is, while repeatedly writing or erasing the memory device, the threshold level of the dummy cells is gradually increased to be high, and it causes erroneous read.

SUMMARY OF THE INVENTION

According to an aspect of the present invention, there is provided a non-volatile semiconductor memory device including a NAND cell unit with a plurality of electrically rewritable and non-volatile memory cells connected in series, one end thereof being coupled to a bit line via a first select gate transistor while the other end is coupled to a source line via a second select gate transistor, wherein the memory device has an erase-verify mode for verifying an erase state of the memory cells in the NAND cell unit, the erase-verify mode including two verify-read operations adapted according to cell ranges to be erase-verified in the NAND cell unit.

According to another aspect of the present invention, there is provided a method of erasing a non-volatile semiconductor memory device, which includes a NAND cell unit with a plurality of electrically rewritable and non-volatile memory cells connected in series, one end thereof being coupled to a bit line via a first select gate transistor while the other end is coupled to a source line via a second select gate transistor, including:

erasing all memory cells in the NAND cell unit; and erase-verifying the all memory cells with first and second verify-read operations adapted according to cell ranges to be erase-verified in the NAND cell unit.

According to still another aspect of the present invention, there is provided a method of erasing a non-volatile semiconductor memory device, which includes a NAND cell unit with a plurality of electrically rewritable and non-volatile memory cells connected in series, one end thereof being coupled to a bit line via a first select gate transistor while the other end is coupled to a source line via a second select gate transistor, including:

erasing all memory cells in the NAND cell unit;

judging whether the number of erase operations has reached a predetermined value or not;

erase-verifying the all memory cells in a lump with a conventional verify-reading procedure while the number of erase operations in not over the predetermined value; and erase-verifying the all memory cells with first and second verify-read operations adapted according to cell ranges to be erase-verified in the NAND cell unit when the number of erase operations is over the predetermined value.

DETAILED DESCRIPTION OF THE EMBODIMENTS

Illustrative embodiments of this invention will be explained with reference to the accompanying drawings below.

Figure 1:
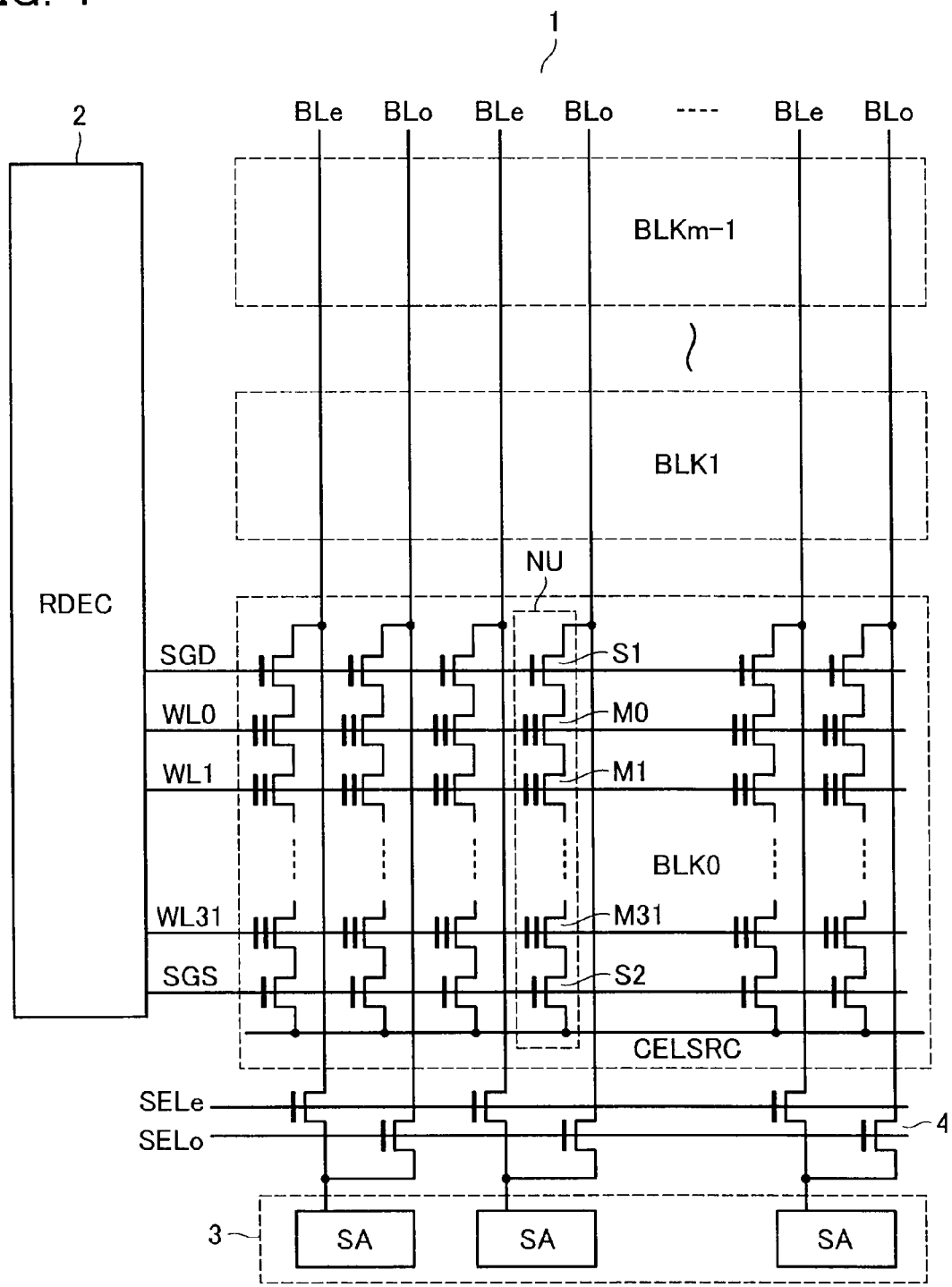
FIG. 1 shows a memory cote of a NAND-type flash memory in accordance with an embodiment.

FIG. 1 shows a memory core of a NAND-type of flash memory in accordance with this embodiment. Memory cell array 1 is formed of NAND cell units (NAND strings), NU, arranged therein, each of which has multiple (32 in this case) memory cells M0-M31 connected in series.

One end of the NAND string NU is coupled to a bit line BL via a select gate transistor S1 while the other end is coupled to a common source line CELSRC via another select gate transistor S2. Control gates of memory cells M0-M31 are coupled to word lines WL0-WL31, respectively; and gates of select gate transistors S1 and S2 to select gate lines SGD and SGS, respectively.

A set of NAND strings sharing word lines constitutes a block serving as an erase unit. As shown in FIG. 1, memory cell array 1 usually includes multiple blocks BLK0-BLKm-1 arranged in the bit line direction.

To selectively drive word lines and select gate lines, row decoder 2 is disposed. To read or write one page data simultaneously, a sense amplifier circuit 3 is prepared to have one page sense amplifiers S/A.

One of adjacent two bit lines is coupled to the sense amplifier S/A. That is, even-numbered bit lines BLe or odd-numbered bit lines BLo are selected by bit line select circuit 4 to be coupled to sense amplifiers S/A. A set of memory cells selected by even-numbered (or odd-numbered) bit lines and a selected word line constitute a physical page serving as a simultaneous-read or write unit. In a read mode, unselected bit lines serves as shield lines with a fixed potential. This situation is set not only in a normal read operation but also in a write-verify read operation and an erase-verify read operation.

Figure 2:
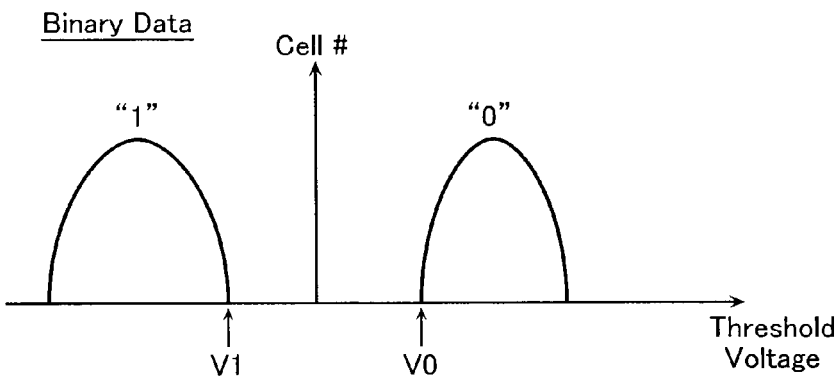
FIG. 2 shows the data threshold distribution in case of a binary data storage scheme.

FIG. 2 shows a data threshold distribution in case of a binary data storage scheme, in which an erase state with a negative threshold voltage is defined as data "1" while a positive threshold voltage state obtained by raising an erase cell's threshold level is defined as data "0". In an erase mode, erase-verify is performed for assuring the upper limit V1 of the target threshold voltage. In a write mode, write-verify is performed for assuring the lower limit V0 of the target threshold voltage.

Figure 3:
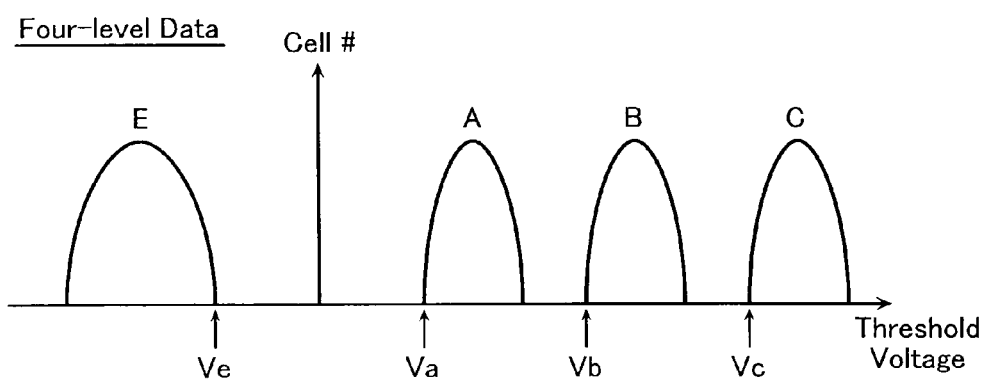
FIG. 3 shows the data threshold distribution in case of a four level data storage scheme.

FIG. 3 shows a data threshold distribution in case of a four level data storage scheme defined by 2 bits/cell, in which an erase state with a negative threshold is defined as data level "E" while three positive threshold voltage states obtained by raising an erase cell's threshold level are defined as data levels "A", "B" and "C" (where A<B<C). In an erase mode, erase-verify is performed for assuring the upper limit Ve of the target threshold voltage. In a write mode, three write-verify operations are performed for assuring the lower limits Va, Vb and Vc (where Va<Vb<Vc) of the three target threshold voltages.

Recently, to achieve a more highly integrated flash memory, it is used a multi-level data storage scheme such as 3 bits/cell or more. In this case, the same write or erase scheme may be used as described above.

[Problems to be Solved]

Next, it will be explained problems to be solved in an erase-verify operation of a normal NAND-type flash memory.

Figure 4:
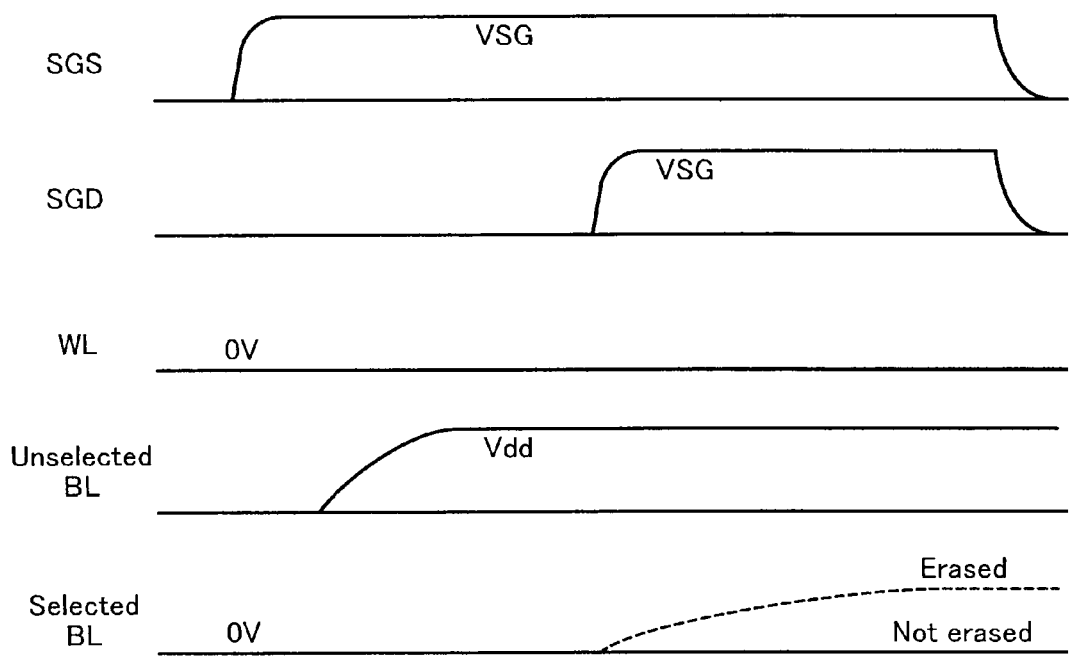
FIG. 4 shows waveforms in the conventional erase-verify operation.

FIG. 4 shows voltage waveforms in the erase-verify operation of the normal NAND-type flash memory. The erase-verify operation is for verifying that all cells in a selected block are set under a certain negative threshold state. For this purpose, as shown in FIG. 4, all word line in the selected block are set at 0V; select gate line SGS on the common source line CELSRC side is raised to VSG; common source line CELSRC is applied with bit line charging voltage Vdd (not shown); and select gate line SGD on the bit line side is raised to VSG last. Under this bias condition, it is judged with sense amplifiers S/A whether the bit lines are charged up or not.

If there is at least one memory cell in a NAND cell unit, which is not set at a negative threshold state (i.e., the cell is insufficiently erased), the corresponding bit line is not charged up because the cell is not turned on with the word line voltage 0V. In case all memory cells in the NAND cell unit are erased to a target threshold level, the corresponding bit line is charged up as shown by a dotted line in FIG. 4.

With the word line voltage 0V, the bit line charged up level is defined as the cell threshold level (absolute value). As a result, the NAND cell unit's erase state will be judged. Since even-numbered bit lines or odd-numbered bit lines are selected simultaneously, unselected bit lines are set at Vdd. Therefore, the selected block is erase-verified by halves.

In this erase-verify operation, when the select gate lines SGD and SGS are changed in level, adjacent word lines are influenced with coupling noises. If these word lines are temporally changed in level with the coupling noises, cells under the word lines may transfer voltage in spite of that these have not been erased into a predetermined negative threshold voltage state.

Even if the level change speed of the select gate lines SGD and SGS are made to be slow for suppressing the influences of the coupling noises, the influences will not be avoided in case the cell integration and shrinking are advanced more. That is, it becomes difficult to assure the erase threshold level of cells disposed adjacent to the select gate lines.

In the cells adjacent to the select gate lines, the problem of erroneous write due to GIDL also becomes serious in case the cell integration and shrinking are advanced more. In consideration of this, the cells adjacent to the select gate lines are often dealt with dummy cells; and the corresponding word lines with dummy word lines. In this case, since the dummy cells are not used for storing data, it appears that it does not matter what threshold level is set in the dummy cells.

However, the select gate lines SGD and SGS are set in a floating state in the erase mode. Therefore, the select gate lines SGD and SGS are boosted to near the erase voltage Vera applied to the p-type well, so that adjacent dummy cells becomes difficult to be erased with the influences of coupling noises. As a result, as write or erase operations are repeatedly performed, the threshold of the dummy cells is gradually increased, and it leads to erroneous read. Therefore, even if cells are dealt with dummy cells, it becomes material to assure the erase level.

Next, it will be explained some embodiments solving the above-described problems.

Embodiment 1

Figure 5:
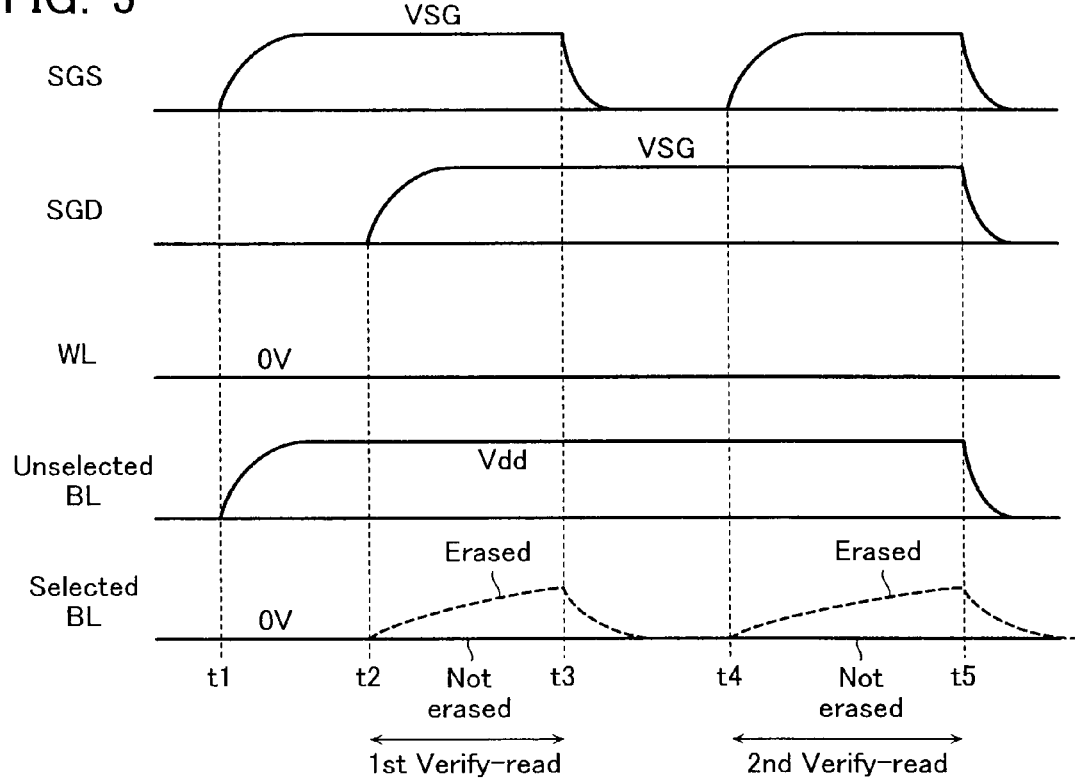
FIG. 5 shows waveforms in the erase-verify mode in accordance with embodiment 1.
Figure 6:
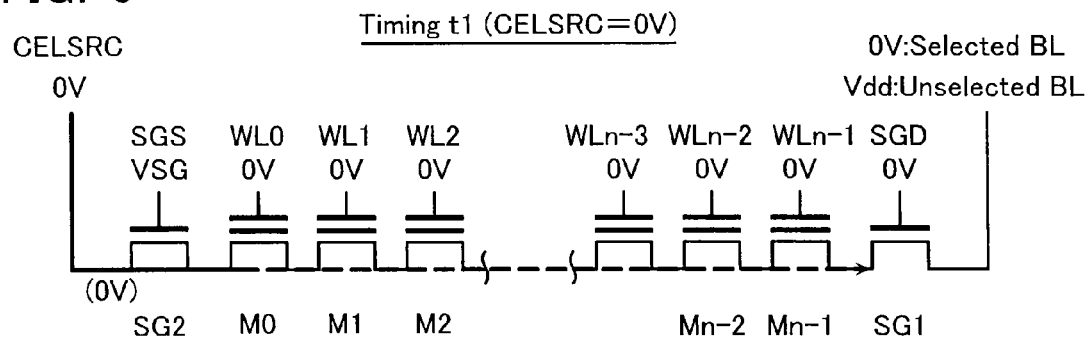
FIG. 6 shows the state of NAND cell unit at timing t1 (in case of CELSRC=0V).

FIG. 5 shows operation waveforms in an erase-verify mode in accordance with embodiment 1 in comparison with those shown in FIG. 4. FIGS. 6 to 11 show the bias conditions and the operations in a NAND string at the respective timings.

In the erase-verify mode, all word lines and select gate line SGD on the bit line side in a selected block are set at 0V; select gate line SGS on the source line side is applied with a voltage (VSG), which sufficiently turns on select gate transistor S2; and selected bit lines are set at 0V under the control of sense amplifiers S/A (timing t1). Unselected bit lines are set at Vdd. 0V applied to the word lines is a verify-read use one, which is necessary to verify the negative threshold voltage of the erased cell. Therefore, a suitable voltage excepting 0V may be used for driving word lines.

If cell source line CELSRC in the selected block is 0V at timing t1 when select gate line SGS is raised, the adjacent word line WL0 is boosted instantaneously due to coupling noise. However, the cell channel in the NAND string is not charged up (refer to FIG. 6).

Figure 7:
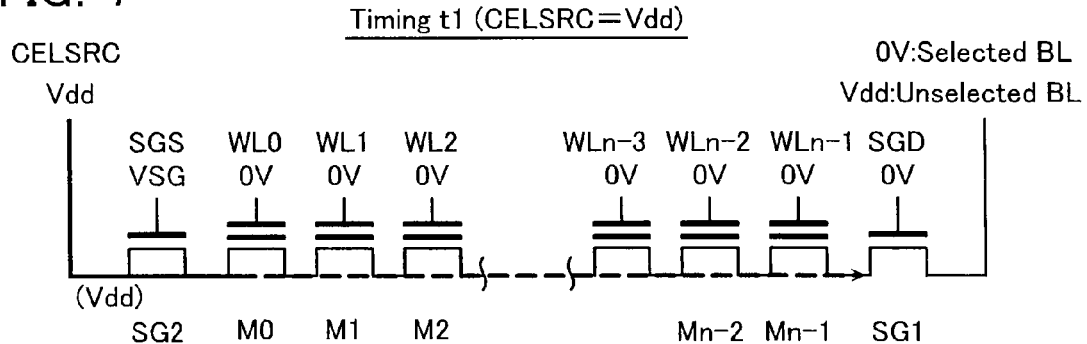
FIG. 7 shows the state of NAND cell unit at timing t1 (in case of CELSRC=Vdd).

In practice, cell source line CELSRC is applied with bit line charging voltage Vdd at timing t1 or slightly before or after. As a result, in case cells M0-Mn-1 under the word lines WL0-WLn-1 are sufficiently erased, as shown in FIG. 7, the cell channel in the NAND string is charged up to Vdd.

Figure 8:
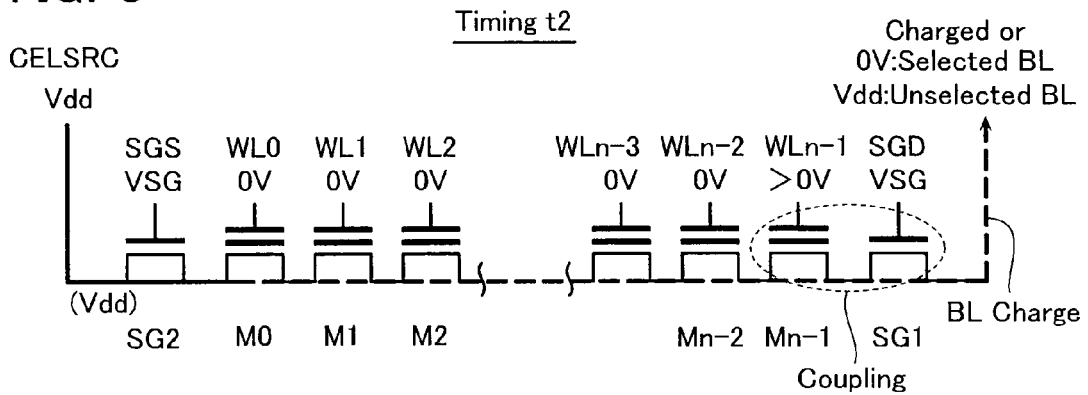
FIG. 8 shows the state of NAND cell unit at timing t2.

Then, later than the select gate line SGS, bit line side select gate line SGD is applied with VSG, which sufficiently turns on the select gate transistor S1 (timing t2). As a result, as shown in FIG. 8, the selected bit line is charged up via the NAND string in case all cells in the NAND string are erased.

At this time, since word line WLn-1 disposed adjacent to the select gate line SGD is boosted instantaneously due to coupling noise, the erase level of cell Mn-1 under the word line WLn-1 is not assured. That is, even if cell Mn-1 is not sufficiently erased, it is turned on due to coupling noise, and judged as being erased. The remaining cells M0-Mn-2 are not influenced with the coupling noise from the select gate line, so that erase levels thereof are assured.

Figure 9:
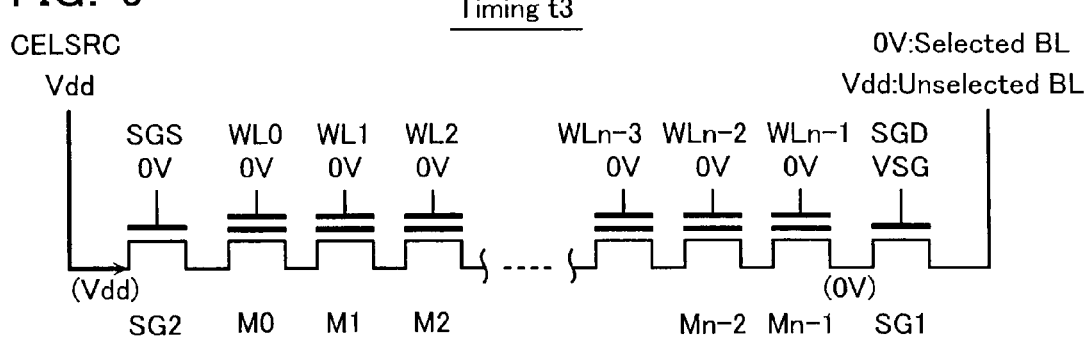
FIG. 9 shows the state of NAND cell unit at timing t3.

In consideration of the above-described situation, additional verify-read operation will be performed for precisely verifying the erase level of memory cell Mn-1. That is, keeping as it is the state that cell source line CELSRC, word lines and bit line side select gate line SGD are at Vdd, 0V and VSG, respectively, cell source line side select gate line SGS and selected bit lines are temporally set at 0V (timing t3). As a result, the NAND string channel and selected bit lines are discharged as shown in FIG. 9.

Then, cell source line side select gate line SGS is applied with VSG again, so that select gate transistor S2 is turned on (timing t4). At this time, cells under word lines WL0-WLn-2 are on because these have been erased in the former operation.

Figure 10:
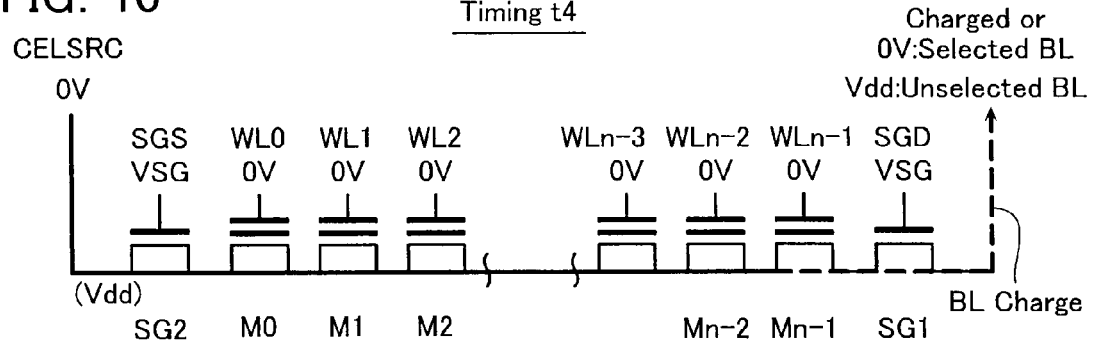
FIG. 10 shows the state of NAND cell unit at timing t4.

Therefore, after timing t4, only in a case that cell Mn-1 under the word line WLn-1 is sufficiently erased, the corresponding selected bit line is charged up as shown by a dotted line in FIG. 10. Select gate line SGD has been raised before, there is no coupling noise to the adjacent word line WLn-1. Therefore, cell Mn-1 under the word line WLn-1 may be verify-read without coupling noise.

As described above, in the timing chart shown in FIG. 5, the detection of the bit line charging during t1-t2 serves as a first verify-read operation for all cells M0-Mn-1. However, cell Mn-1 disposed adjacent to the select gate transistor SG1 is not subjected to a correct verify-read operation because it is influenced with a coupling noise. Therefore, the first verify-read operation is for substantially assuring the erase state of cells M0-Mn-2 excepting the cell Mn-1 disposed adjacent to the select gate line SGD. And the following detection of the bit line charging during t4-t5 serves as a second verify-read operation for cell Mn-1 disposed adjacent to the select gate transistor SG1 without coupling noise.

With these erase-verify operations, the erase state of cell Mn-1 under word line WLn-1, which is adjacent to the select gate line SGD, will be verified individually from other cells M0-Mn-2 and without the influence of coupling noise.

Embodiment 2

In the above-described embodiment 1, during the latter verify-read operation for assuring the erase level of cell Mn-1 under the word line WLn-1, other word lines are kept as 0V. However, since cells under these word lines have already been erase-verified in the former verify-read operation, it is not required of these cells to be set in the same operation state as the former operation. That is, in the latter verify-read operation, the erase-verified cells may be used as pass transistors, which are deeply turned on.

Figure 11:
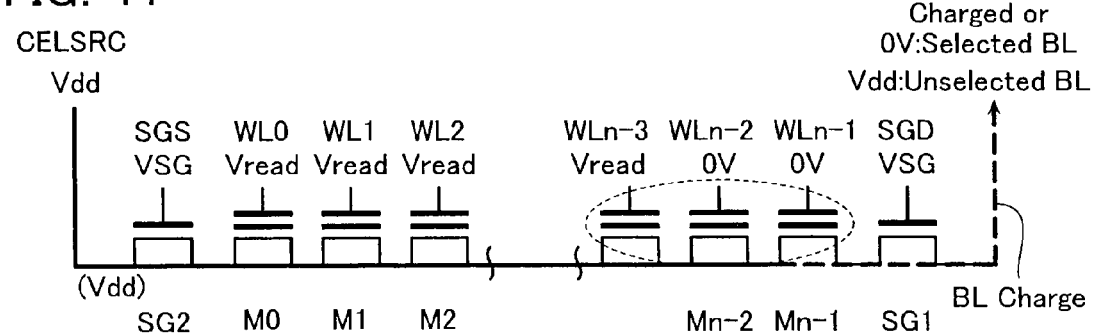
FIG. 11 shows the state of NAND cell unit in accordance with embodiment 2 in correspondence to that shown in FIG. 10.

In detail, FIG. 11 shows another erase-verify bias condition in comparison with that shown in FIG. 10. During the erase-verify operation of cell Mn-1 under word line WLn-1, in such a word line region that the coupling noise on the word line WLn-1 is neglected, for example, word lines WL0-WLn-3 are applied with read pass voltage, Vread, which is set at higher than the normal verify-read voltage, 0V. As a result, the on-state channel resistance of cells M0-Mn-3 is lessened, so that the bit line charge operation at the erase verify-read time will be sped up.

Embodiment 3

Figure 12:
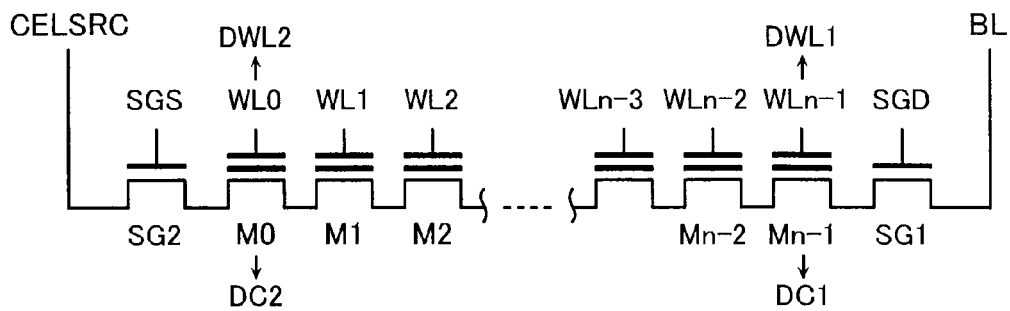
FIG. 12 shows a NAND cell unit in accordance with embodiment 3, in which cells on the both ends serve as dummy cells.

FIG. 12 shows a case that word lines WL0 and WLn-1 on the both ends of the NAND string are dealt with dummy word lines DWL2 and DWL1, respectively, and cells M0 and Mn-1 under these word liens are dealt with dummy cells DC2 and DC1, respectively.

The methods explained in the embodiments 1 and 2 are useful in this case that cells disposed adjacent to select gate transistors are dealt with dummy cells. That is, according to the same erase-verify as in the embodiments 1 and 2, the erase level of dummy cells may be assured.

Embodiment 4

In case cells disposed adjacent to the select gate transistors serve as dummy cells, these are not used for storing data. Therefore, it is not required of these dummy cells to be severely assured like the data storing cells. In consideration of this, in the case of embodiment 3, it is useful that the erase-verify methods explained in the embodiments 1 and 2 are adapted only when the number of erase operations reached a certain value.

Figure 13:
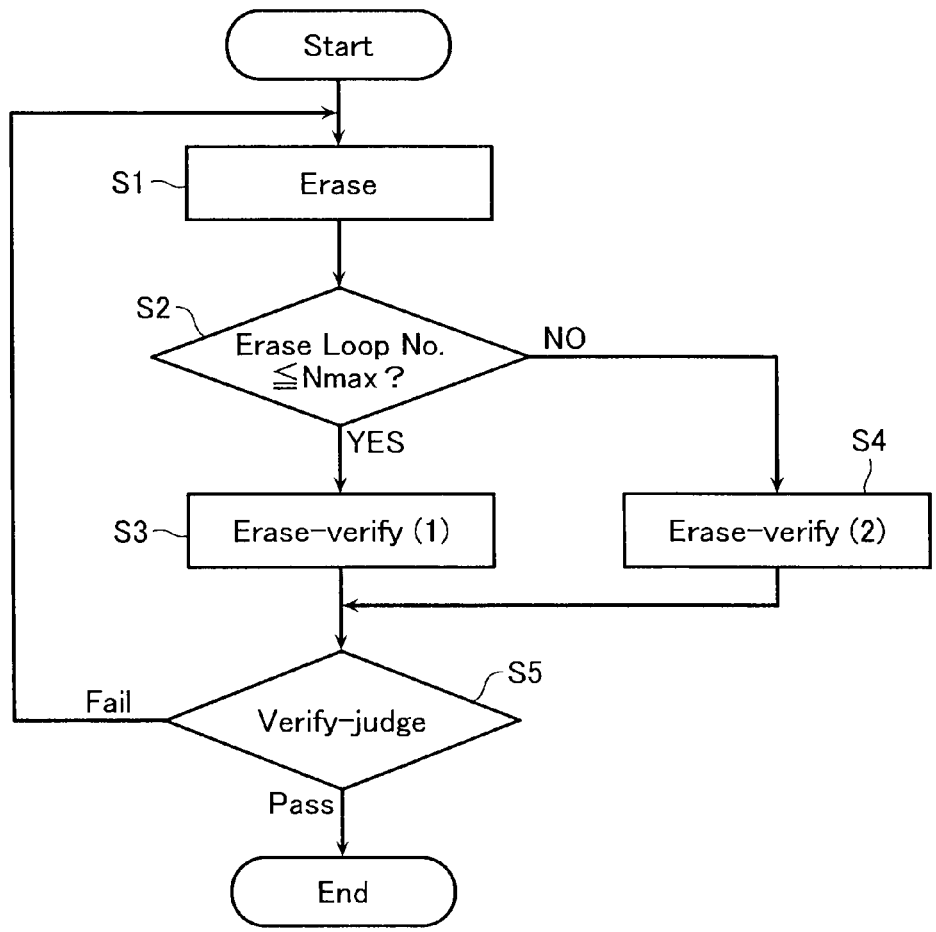
FIG. 13 shows an erase sequence in accordance with embodiment 4.

FIG. 13 shows an erase sequence in accordance with embodiment 4. After erase step S1, it is detected whether the erase loop number reached a predetermined value Nmax or not (step S2). If the number is not over Nmax, verify-read is performed with the normal erase-verify scheme (1) (step S3). If the number is over Mmax, verify-read is performed with the erase-verify scheme (2) explained in the embodiment 1 or 2 (step S4).

Thereafter, verify-judge is performed (step S5). If the erase of all target cells is not verified, erase and verify-read will be repeatedly performed.

When the erase number reaches the value Nmax, an internal counter prepared for counting the erase number is initialized, and the normal erase-verify scheme will be adapted until when the erase number reaches Nmax again. According to this embodiment, in which the conventional erase-verify scheme is used until when the erase number reaches Nmax, it becomes possible to prevent the usual erase operation from being reduced in speed.

Figure 14:
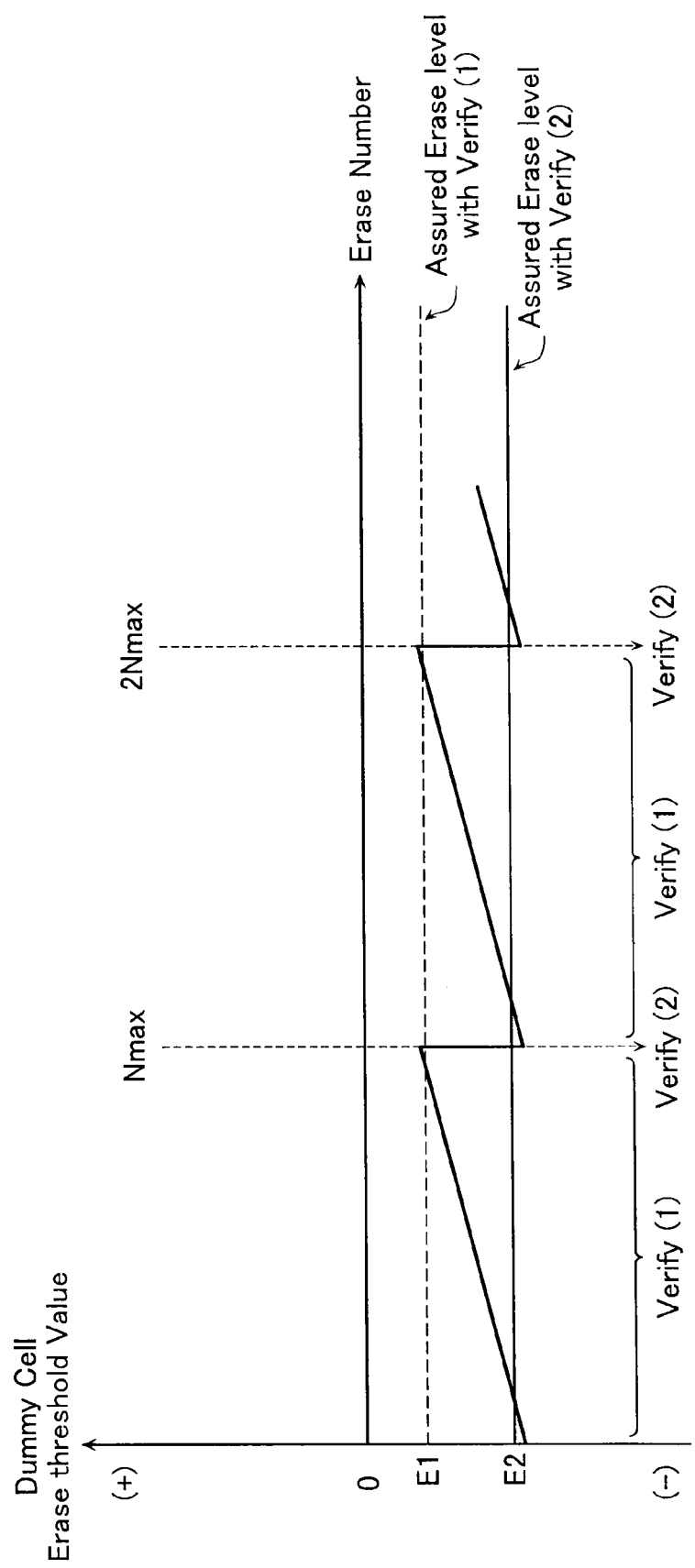
FIG. 14 shows the erased threshold level change in case the embodiment 4 is adapted.

FIG. 14 shows the change of the erased threshold level of dummy cells. While the conventional erase-verify scheme (1) is used, the erased level is gradually increased in accordance with the increase of the number of erase operations. According to this embodiment 4, it is dealt with that the erase-verify scheme (2) is adapted only when the erase number reaches Nmax. As a result, the dummy cell's erase level may be reduced to level E2 assured with the erase-verify scheme (2) from E1.

Therefore, without reducing the erase loop speed in the normal operations, it becomes possible to prevent the flash memory from being erroneously read due to the over-increased dummy cell's threshold voltage. It should be noted here that the erase sequence in accordance with this embodiment is useful except the case that the cells near the select gate lines serve as dummy cells.

[Application Devices]

As an embodiment, an electric card using the non-volatile semiconductor memory devices according to the above-described embodiments of the present invention and an electric device using the card will be described bellow.

Figure 15:
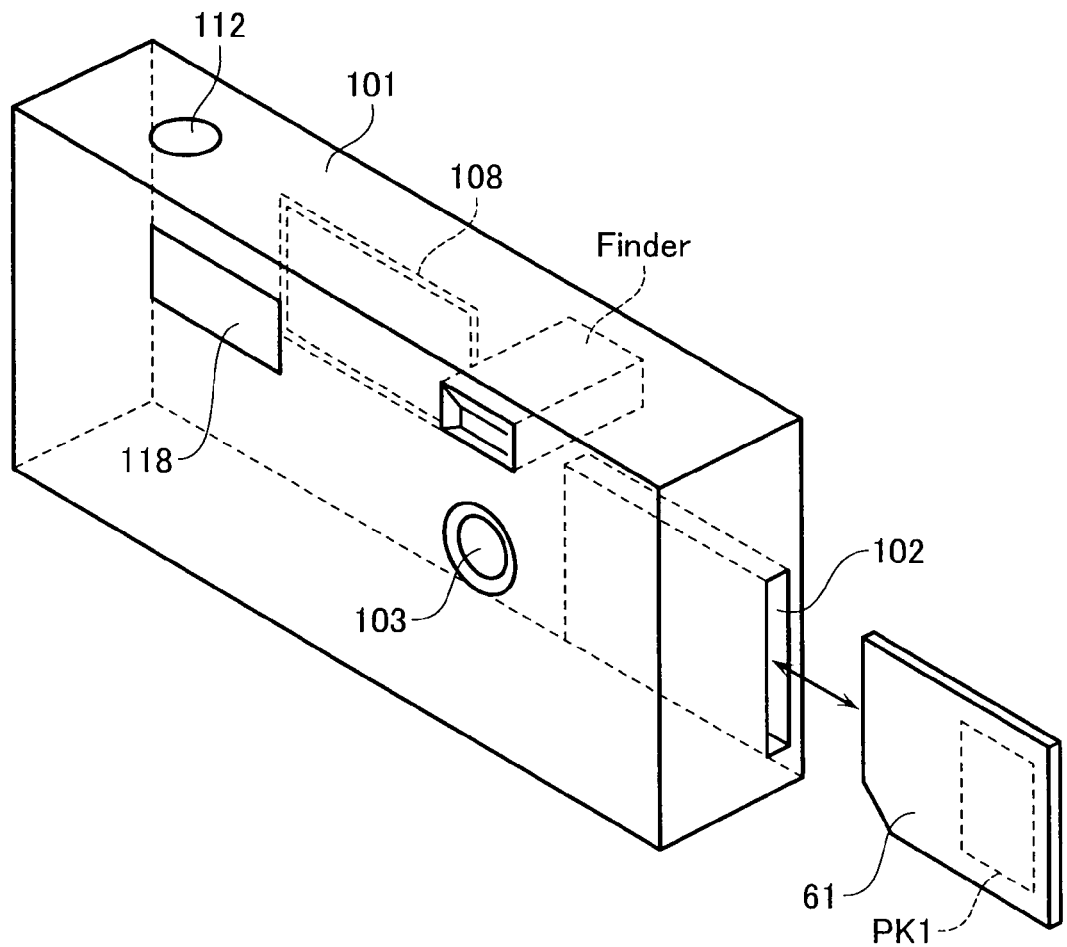
FIG. 15 shows another embodiment applied to a digital still camera.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
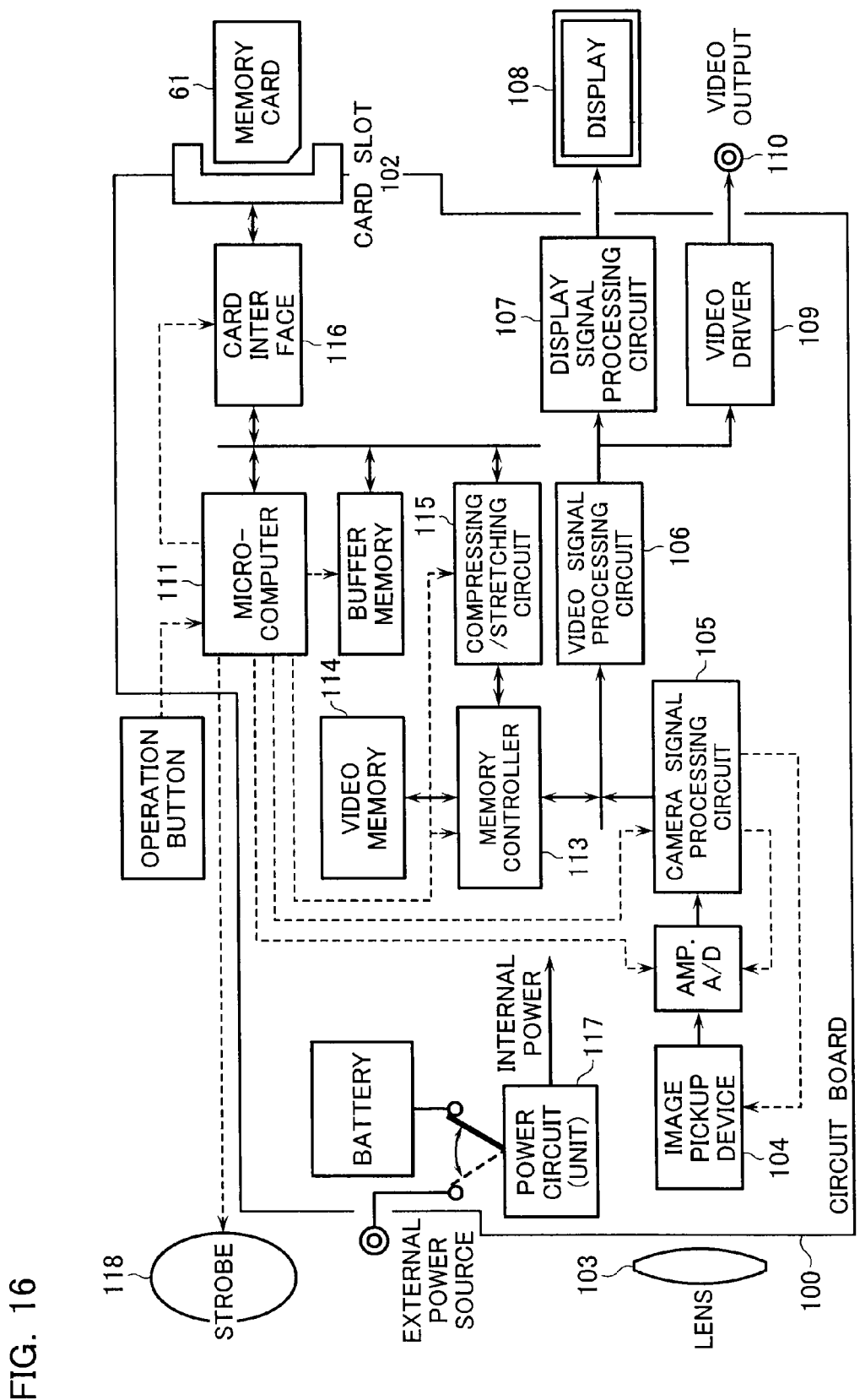
FIG. 16 shows the internal configuration of the digital still camera.
Figure 17A:
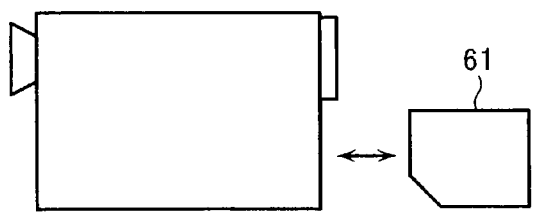
FIGS. 17A to 17J show other electric devices to which the embodiment is applied.
Figure 17F:
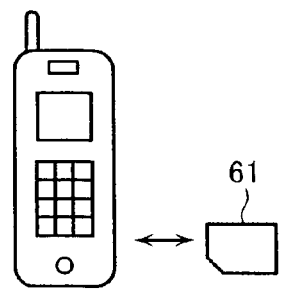
Figure 17B:
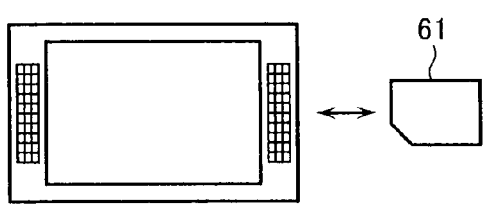
Figure 17G:
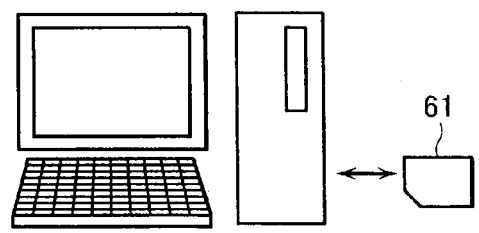
Figure 17C:
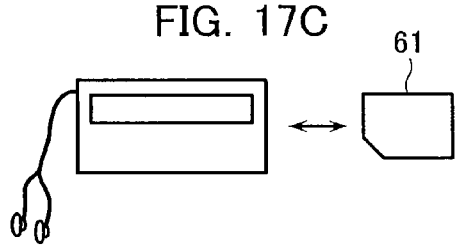
Figure 17H:
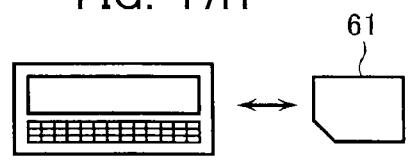
Figure 17D:
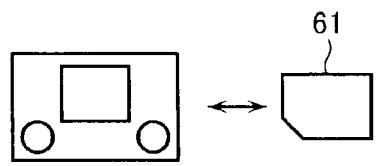
Figure 17I:
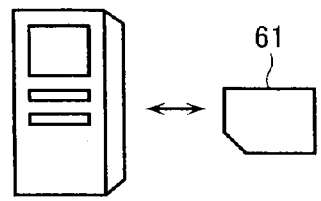
Figure 17E:
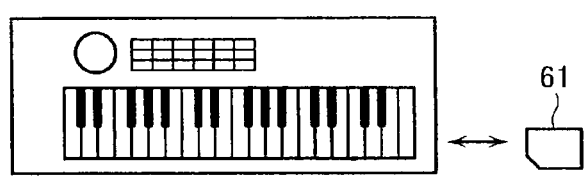
Figure 17J:
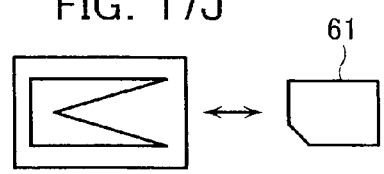

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

This invention is not limited to the above-described embodiment. It will be understood by those skilled in the art that various changes in form and detail may be made without departing from the spirit, scope, and teaching of the invention.

What is claimed is:

1. A non-volatile semiconductor memory device comprising a NAND cell unit with a plurality of electrically rewritable and non-volatile memory cells connected in series, one end thereof being coupled to a bit line via a first select gate transistor while the other end is coupled to a source line via a second select gate transistor, wherein
the memory device has an erase-verify mode for verifying an erase state of the memory cells in the NAND cell unit, the erase-verify mode including two verify-read operations adapted according to cell ranges to be erase-verified in the NAND cell unit, and wherein
the two verify-read operations in the erase-verify mode are as follows:
a first verify-read operation is for verifying the erase state of all memory cells in such a way as to detect whether the bit line is charged up or not under the condition that (a) all word lines coupled to control gates of the memory cells in the NAND cell unit are applied with verify-read voltage, (b) the source line is applied with bit line charging voltage, (c) the second select gate transistor is turned on, and (d) the first select gate transistor is turned on later than the second select gate transistor; and
a second verify-read operation is for verifying the erase state of the memory cell disposed adjacent to the first select gate transistor after the first verify-read operation in such a way as to temporally turn off the second select gate transistor, and make the bit line discharged, and then turn on again the second select gate transistor, thereby detecting whether the bit line is charged up or not under the condition that (e) the bit line charging voltage applied to the source line and the verify-read voltage applied to the word lines are kept as it is, and (f) the first select gate transistor is kept on.

2. The non-volatile semiconductor memory device according to claim 1, wherein
in the second verify-read operation, some word lines corresponding to the memory cells excepting that disposed adjacent to the first select gate transistor are applied with a read pass voltage higher than the verify-read voltage.

3. The non-volatile semiconductor memory device according to claim 1, wherein
two memory cells disposed adjacent to the first and second select gate transistors in the NAND cell unit serve as dummy cells, which are not used for storing data.

4. The non-volatile semiconductor memory device according to claim 1, wherein
the erase-verify mode including the two verify-read operations is adapted only when the erase number is over a certain value while all memory cells in the NAND cell unit are erase-verified in a lump at remaining erase-verify times.

5. A method of erasing a non-volatile semiconductor memory device, which comprises a NAND cell unit with a plurality of electrically rewritable and non-volatile memory cells connected in series, one end thereof being coupled to a bit line via a first select gate transistor while the other end is coupled to a source line via a second select gate transistor, comprising:
erasing all memory cells in the NAND cell unit, and
erase-verifying the all memory cells with first and second verify-read operations adapted according to cell ranges to be erase-verified in the NAND cell unit, wherein
the first verify-read operation is for verifying an erase state of the all memory cells in such a way as to detect whether the bit line is charged up or not under the condition that (a) all word lines coupled to control gates of the memory cells in the NAND cell unit are applied with verify-read voltage, (b) the source line is applied with bit line charging voltage, (c) the second select gate transistor is turned on, and (d) the first select gate transistor is turned on later than the second select gate transistor, and wherein
the second verify-read operation is for verifying the erase state of the memory cell disposed adjacent to the first select gate transistor following the first verify-read operation in such a way as to temporally turn off the second select gate transistor, and make the bit line discharged, and then turn on again the second select gate transistor, thereby detecting whether the bit line is charged up or not under the condition that (e) the bit line charging voltage applied to the source line and the verify-read voltage applied to the word lines are kept as it is, and (f) the first select gate transistor is kept on.

6. The method according to claim 5, wherein
in the second verify-read operation, some word lines corresponding to the memory cells excepting that disposed adjacent to the first select gate transistor are applied with a read pass voltage higher than the verify-read voltage.

7. The method according to claim 5, wherein
two memory cells disposed adjacent to the first and second select gate transistors in the NAND cell unit serve as dummy cells, which are not used for storing data.

8. The method according to claim 5, wherein
the erase-verifying procedure including the first and second verify-read operations is adapted only when the erase number is over a certain value while a conventional erase-verify procedure is adapted for verify-reading all memory cells in the NAND cell unit in a lump at remaining erase-verify times.

9. A method of erasing a non-volatile semiconductor memory device, which comprises a NAND cell unit with a plurality of electrically rewritable and non-volatile memory cells connected in series, one end thereof being coupled to a bit line via a first select gate transistor while the other end is coupled to a source line via a second select gate transistor, comprising:
erasing all memory cells in the NAND cell unit;
judging whether a number of erase operations has reached a predetermined value or not;
erase-verifying the all memory cells in a lump with a conventional verify-reading procedure while the number of erase operations is not over the predetermined value; and
erase-verifying the all memory cells with first and second verify-read operations adapted according to cell ranges to be erase-verified in the NAND cell unit when the number of erase operations is over the predetermined value, wherein
the first verify-read operation is for verifying an erase state of the all memory cells in such a way as to detect whether the bit line is charged up or not under the condition that (a) all word lines coupled to the control gates of the memory cells in the NAND cell unit are applied with verify-read voltage, (b) the source line is applied with bit line charging voltage, (c) the second select gate transistor is turned on, and (d) the first select gate transistor is turned on later than the second select gate transistor, and wherein the second verify-read operation is for verifying the erase state of the memory cell disposed adjacent to the first select gate transistor following the first verify-read operation in such a way as to temporally turn off the second select gate transistor, and make the bit line discharged, and then turn on again the second select gate transistor, thereby detecting whether the bit line is charged up or not under the condition that (e) the bit line charging voltage applied to the source line and the verify-read voltage applied to the word lines are kept as it is, and (f) the first select gate transistor is kept on.

10. The method according to claim 9, wherein
in the second verify-read operation, some word lines corresponding to the memory cells excepting that disposed adjacent to the first select gate transistor are applied with a read pass voltage higher than the verify-read voltage.

11. The method according to claim 9, wherein
two memory cells disposed adjacent to the first and second select gate transistors in the NAND cell unit serve as dummy cells, which are not used for storing data.

* * * * *